US006929506B2

(12) United States Patent
Petricek et al.

(10) Patent No.: US 6,929,506 B2
(45) Date of Patent: Aug. 16, 2005

(54) MOUNTING ELEMENT FOR CONNECTING A COMPONENT TO A CIRCUIT BOARD

(75) Inventors: Martin Petricek, Hollabrunn (AT); Thomas Rothmayer, Vienna (AT)

(73) Assignee: Siemens AG Osterreich, Vienna ( * ) Notice: Subject to any disclaimer, the term of this patent is extended or adjusted under 35 U.S.C. 154(b) by 0 days.

(21) Appl. No.: 10/485,054

(22) PCT Filed: May 15, 2002

(86) PCT No.: PCT/AT02/00147
§ 371 (c)(1),
(2), (4) Date: Jan. 26, 2004

(87) PCT Pub. No.: WO03/012302
PCT Pub. Date: Feb. 13, 2003

(65) Prior Publication Data
US 2004/0190277 A1 Sep. 30, 2004

(30) Foreign Application Priority Data
Jul. 27, 2001 (AT) ........................ A 1128/2001

(51) Int. Cl.⁷ ............................................. H01R 13/60
(52) U.S. Cl. ..................................... 439/567; 403/230
(58) Field of Search ................................. 439/567, 557, 439/571, 527; 361/803; 403/230

(56) References Cited

U.S. PATENT DOCUMENTS

| 4,824,398 A | * | 4/1989 | Taylor ........................ 439/557 |
| 5,322,452 A | * | 6/1994 | Mosquera .................... 439/567 |
| 5,407,364 A | * | 4/1995 | Tzeng et al. ................. 439/567 |
| 5,435,750 A | * | 7/1995 | Kosmala ...................... 439/567 |
| 5,816,855 A | * | 10/1998 | Pesson ........................ 439/567 |
| 5,827,089 A | * | 10/1998 | Beck, Jr. ..................... 439/567 |
| 5,868,586 A | * | 2/1999 | Maejima ...................... 439/567 |
| 6,106,332 A | * | 8/2000 | Souisa ........................ 439/571 |

* cited by examiner

Primary Examiner—Michael C. Zarroli
(74) Attorney, Agent, or Firm—Welsh & Katz, Ltd.

(57) ABSTRACT

The invention relates to a mounting element (MON) for joining a component (BAU) to a circuit carrier (STR). Said mounting element (MON) comprises a receiving element (AUF) which enables it to be joined to a section (ABS) of the component (BAU) in a positive fit. Said mounting element (MON) comprises at least one snap hook (SH1, SH2) which can be engaged in a mounting opening (MOE) of the circuit carrier (STR).

9 Claims, 2 Drawing Sheets

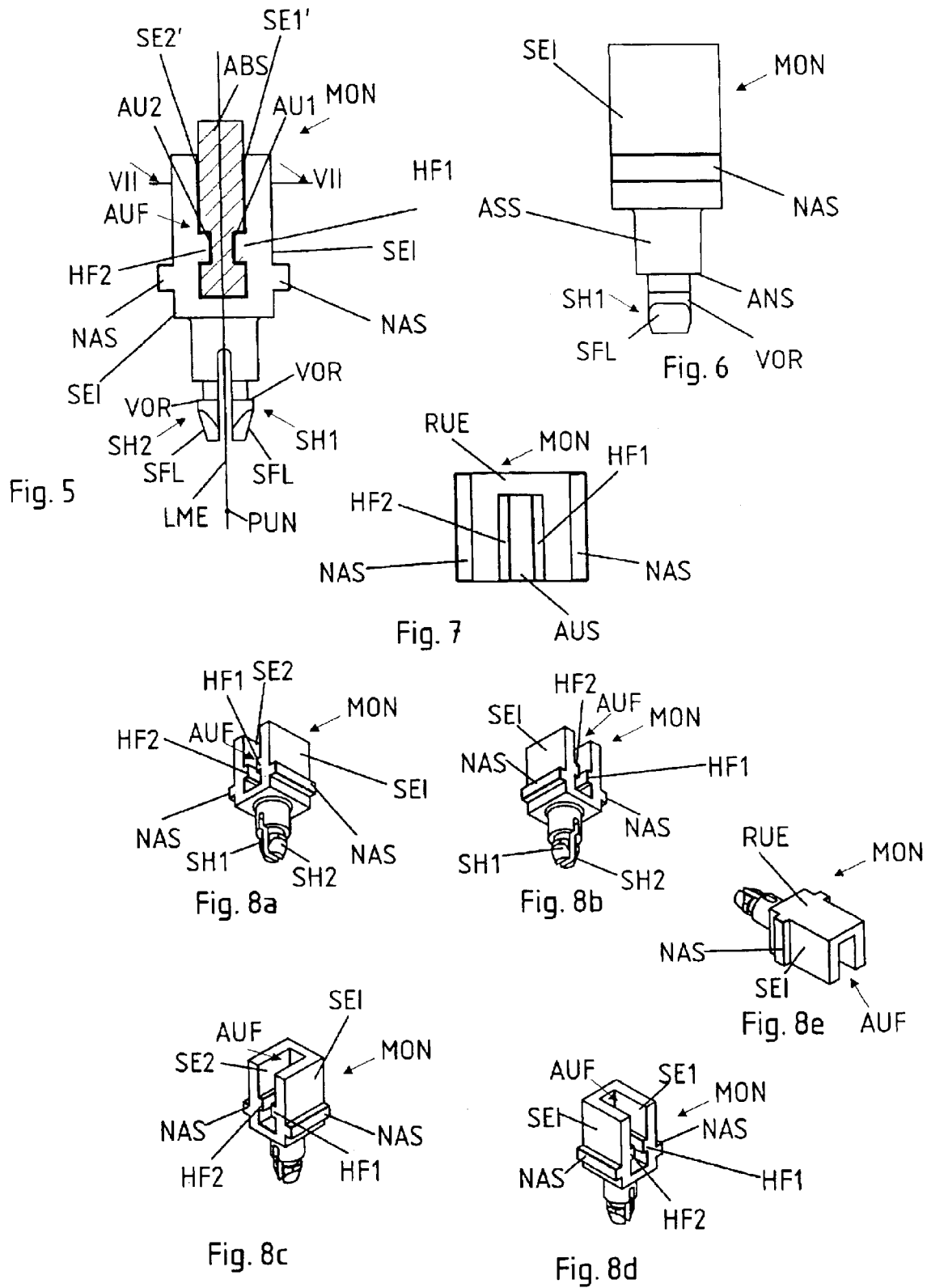

MOUNTING ELEMENT FOR CONNECTING A COMPONENT TO A CIRCUIT BOARD

CROSS REFERENCE TO RELATED APPLICATIONS

This application is a national stage application of PCT Application PCT/AT02/00147, filed May 15, 2002, which claims priority from Austrian Patent Application No. A 1182/2001, filed Jul. 27, 2001.

1. Field of the Invention

The invention relates to a mounting element for connecting a component to a circuit carrier.

2. Description of the Related Art

During the manufacturing of electronic apparatus intended to be provided with circuit carriers, more specifically with printed circuit boards, mounting of the components onto the circuit carrier may lead to damages. More specifically if heavy components such as heat sinks are to be mounted to circuit carriers, this operation involves a high risk of damage because of the screw connections usually utilized for this purpose.

When heat sinks are to be connected to the circuit carrier or the printed circuit board respectively, it is known to screw the heat sink to the circuit carrier prior to installing the assembled units into a housing. This operation requires special devices and moreover involves the risk of damage to components that have already been mounted to the printed circuit board.

The known connection methods may not only cause damage to the component or to the circuit carrier respectively, they also involve high expense of time which may result in high manufacturing costs.

BRIEF SUMMARY OF THE INVENTION

It is therefore an object of the invention to provide easy connection between a component and a circuit carrier with said connection making it possible to lower the manufacturing cost while minimizing the risk of damage as a result of mounting.

In accordance with the invention, this object is solved by a mounting element of the type mentioned herein above, said mounting element comprising a receiving means by which it is interlockingly connectable with a portion of the component as well as at least one snap hook that is adapted to be snap-fitted into a mounting hole of the circuit carrier.

The interlocking connection between the mounting element and the component permits to achieve particularly high mechanical stability. After the mounting element and the component are connected, the component may be snap-fitted onto the circuit carrier. The merit of the invention is that no screw connections are needed to connect the component to the circuit carrier, which substantially simplifies the process of mounting and considerably minimizes the risk of damage.

In an advantageous variant of the invention there is provided that the receiving means be surrounded by a wall that forms a generally box shape and is open at least in parts on at least one side face thereof.

In a preferred embodiment of the invention there is provided, on either of the two confronting inner side faces of the wall, an extended holding portion projecting inward from the inner side faces with the extended holding portions being adapted for engagement with complementary formed recesses of the component portion.

Further advantages may be achieved when, at one of its closed side faces, the wall merges into a cylindrical supporting base comprising a stop for the circuit carrier.

At least one snap hook may be disposed on the supporting base.

In a particularly advantageous variant of the invention, the mounting element comprises two confronting snap hooks adapted to snap in opposing directions.

The two snap hooks may form a conical pin that is interlockingly engageable into the mounting hole of the circuit carrier.

In a particularly advantageous variant of the invention, the mounting element is pluggable onto the portion.

If the component is to be electrically isolated from the circuit carrier, the mounting element may be made of electrically isolating plastic material.

If, in contrast, an electrical connection is to be established between the circuit carrier and the component, the mounting element may be made of metal.

The mechanical stability of a complete apparatus consisting of a circuit carrier and of a component to be mounted thereon may be increased by providing the mounting element with at least one lug projecting outward from one of the outer side faces of the wall for the purpose of connecting the component and the circuit carrier to a housing holding the circuit carrier and the component, said lug being interlockingly connectable with an opening in a side wall of the housing.

BRIEF DESCRIPTION OF THE DRAWINGS

The invention and further advantages thereof will become more apparent upon reading the following non restrictive description of some embodiments thereof, given by way of example only, with reference to the drawings in which:

FIG. 5 is a sectional view taken along the line V—V in FIG. 1;

FIG. 6 is a top view of a mounting element of the invention as viewed in direction VI in FIG. 5;

FIG. 7 is a cross-sectional view taken along the line VII—VII in FIG. 5 and

FIGS. 8a–8e are top views of a mounting element of the invention as viewed from different perspectives.

DETAILED DESCRIPTION OF THE INVENTION

Figure 1:
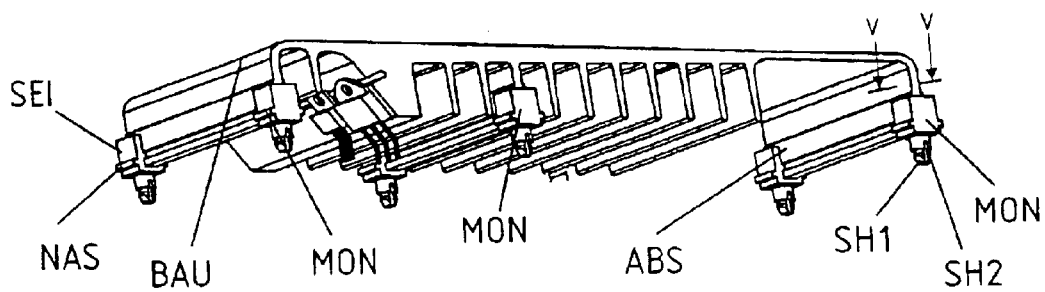
FIG. 1 shows a component with mounting elements in accordance with the invention.
Figure 2:
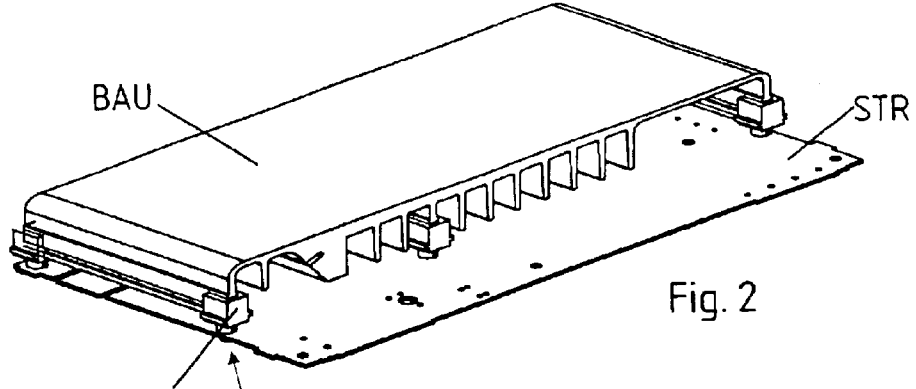
FIG. 2 shows the component of FIG. 1 that is connected to a circuit carrier by means of mounting elements of the invention.

Referring to FIGS. 1 and 2, there is provided a mounting element MON constructed in accordance with the invention for connecting a component BAU such as a heat sink to a circuit carrier STR such as a printed circuit board. The mounting element MON is configured such that it is interlockingly connectable with a portion ABS of the component BAU. The mounting element MON is preferably pluggable onto the portion ABS of the component BAU.

The receiving means AUF may be surrounded by a wall that forms a generally box shape and is open at least in parts on at least one side face SEI, in the present case on two side faces SEI thereof, so that the portion ABS of the component BAU may be inserted into the receiving means AUF.

Figure 4:
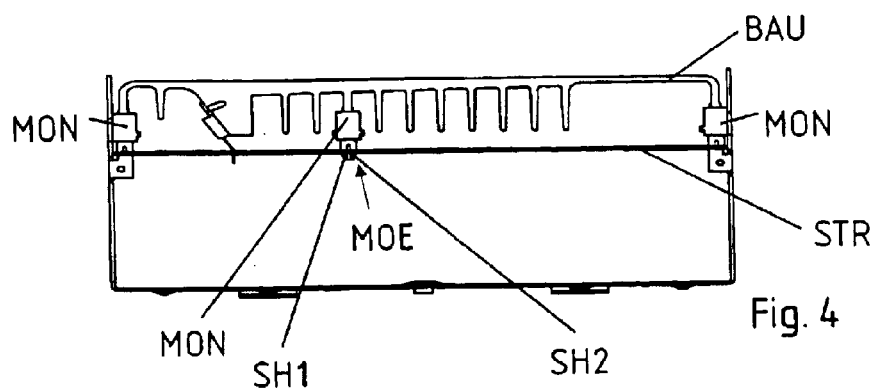
FIG. 4 is a cross-sectional view taken along the line IV—IV in FIG. 3.

In order to allow securing the mounting element MON to the circuit carrier STR and to thus provide a mechanically stable connection between component BAU and circuit carrier STR, the mounting element MON comprises at least one snap hook SH1, SH2 which, in accordance with FIG. 2 and FIG. 4, is snap-fittable into a mounting hole MOE of the circuit carrier STR so that an interlocking connection is established between the mounting element MON and the circuit carrier STR.

Figure 3:
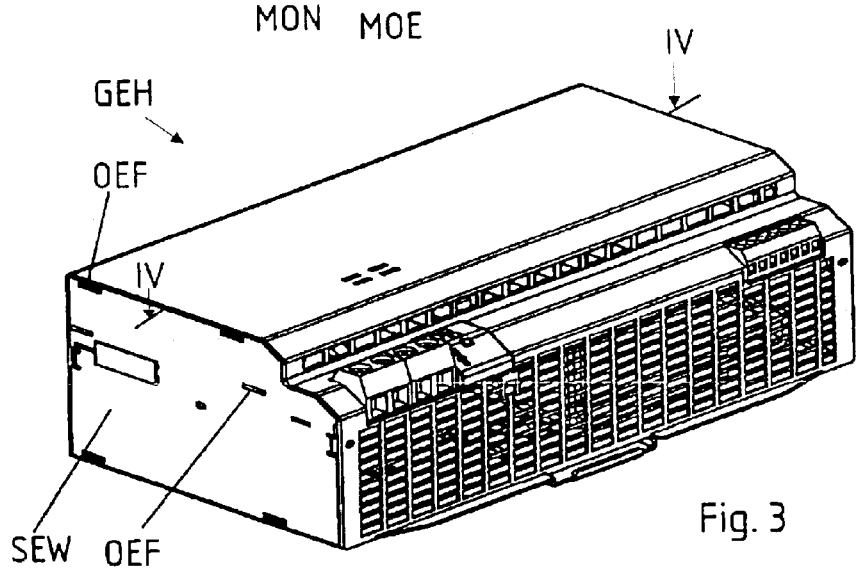
FIG. 3 is a perspective view of a housing comprising the component and the circuit carrier.

In order to further increase the mechanical stability of the connection between the component BAU and the circuit carrier STR, the mounting element MON may be comprised of a lug NAS that is oriented outward, substantially normal to one side face SEI of its wall, with said lug being interlockingly connectable to an opening OEF in a side wall SEW of a housing GEH holding the circuit carrier STR and the component BAU, as shown in FIG. 3.

Referring to FIG. 5 and as already mentioned herein above, the mounting element MON is comprised of a receiving element AUF that is defined by a prismatic wall which is in parts open for receiving the portion ABS of the component BAU. On either of the two confronting inner side faces SE1', SE2' of the wall, there may be provided an extended holding portion HF1, HF2 that projects from the inner side faces SE1', SE2' with the extended holding portions HF1, HF2 being adapted for engagement with complementary formed recesses AU1, AU2 in the portion ABS of component BAU.

Referring to FIG. 5, there are provided two snap hooks SH1, SH2 configured to snap in opposing directions for connecting the mounting element MON to the circuit carrier STR.

One mounting hole is provided, which is common to both of the snap hooks and is sized so that, during mounting, the two hooks are at first bent against each other against the force of a spring and that, in the end position, the circuit carrier STR abuts on projections VOR provided on the snap hooks SH1, SH2, an interlocking connection between circuit carrier STR and mounting element MON being thus established, as already mentioned herein above.

To facilitate insertion of the snap hooks SH1, SH2 into the mounting hole MOE, the two snap hooks SH1, SH2 can be configured such that together they substantially form a conical pin. Meaning, the side faces SFL of the snap hooks SH1, SH2 that are turned away from the longitudinal center plane LME of the mounting element MON may be inclined toward the longitudinal center plane LME of the mounting element MON in such a manner that an extension of the side faces SFL intersects the longitudinal center plane LME at a point PUN located outside of the mounting element MON and opposite the receiving means AUF.

Referring to FIG. 6, the wall merges, at one of its closed side faces SEI, into a cylindrical supporting base ASS comprising a stop ANS for the circuit carrier STR, at least one snap hook SH1, SH2 being disposed on the supporting base ASS. The skewed side faces SFL of the snap hooks SH1, SH2 may merge toward the supporting base ASS into the projection VOR for supporting the mounting element MON on the circuit carrier STR.

Referring to FIG. 7 and to the FIGS. 8a–8b, the receiving means AUF of mounting element MON may be bounded by a rear wall RUE. With this embodiment of the invention the component BAU is effectively prevented from slipping out of place in the longitudinal direction of the extended holding portions HF1. High mechanical stability may further be achieved by arranging two mounting elements MON of such design onto the component BAU (FIGS. 1 and 2) so that they display mirror-image symmetry.

If the component BAU is to be electrically isolated from the circuit carrier, which is the case with heat sinks for example, the mounting element may be made of an electrically isolating plastic material. For instances where the component and the circuit carrier are to be electrically connected, the mounting element MON may also be made of metal.

What is claimed is:

1. A mounting element (MON) for connecting a component (BAU) to a circuit carrier (STR), the mounting element having a receiving means (AUF) by which it is interlockingly connectable with a portion (ABS) of the component (BAU) as well as at least one snap hook (SH1, SH2) that is adapted to be snap-fitted into a mounting hole (MOE) of the circuit carrier (STR), the receiving means (AUF) being surrounded by a wall that forms a generally box shape and is open at least in parts on at least one side face (SEI), and, on either of the two confronting inner side faces (SE1', SE2') of the wall, an extended holding portion (HF1, HF2) projects inward from the inner side faces (SE1', SE2') of the wall, and an extended holding portion (HF1, HF2) projects inward from the inner side faces (SE1', SE2') with the extended holding portions (HF1, HF2) being adapted for engagement with complementary formed recesses (AU1, AU2) in the portion (ABS) of the component (BAU).

2. The mounting element according to claim 1, wherein at one of its closed side faces (SEI) the wall merges into a cylindrical supporting base (ASS) comprising a stop (ANS) for the circuit (STR).

3. The mounting element according to claim 2, wherein at least one snap hook (SH1, SH2) is disposed on the supporting base (ASS).

4. The mounting element according to claim 1, comprising two confronting snap hooks (SH1, SH2) configured to snap in opposing directions (EIR).

5. The mounting element according to claim 4, wherein the two snap hooks (SH1, SH2) form a conical pin that is interlockingly snap-fittable into the mounting hole (MOE) of the circuit carrier.

6. The mounting element according to claim 1, being pluggable onto the portion (ABS) of the component (BAU).

7. The mounting element according to claim 1, being made of an electrically isolating plastic material.

8. The mounting element according to claim 1, being made of metal.

9. A mounting element (MON) for connecting a component (BAU) to a circuit carrier (STR), the mounting element having a receiving means (AUF) by which it is interlockingly connectable with a portion (ABS) of the component (BAU) and at least one snap hook (SH1, SH2) that is adapted to be snap-fitted into a mounting hole (MOE) of the circuit carrier (STR), the receiving means (AUF) being surrounded by a wall that forms a generally box shape and is open at least in parts on at least one side face (SEI), the mounting element (MON) connecting the component (BAU) and the circuit carrier (STR) to a housing (GEH) holding the circuit carrier (STR) and the component (BAU), and the mounting element (MON) comprising at least one lug (NAS) projecting outward from one of the outer side faces (SEI) of the wall, said lug being interlockingly connectable with an opening (OEF) in a side wall (SEW) of the housing (GEH).

* * * * *